(12) United States Patent
Kim

(10) Patent No.: US 6,441,409 B1
(45) Date of Patent: Aug. 27, 2002

(54) DUAL-LINE TYPE CHARGE TRANSFER DEVICE

(75) Inventor: Yong Gwan Kim, Kurokawa-gun (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 09/298,845

(22) Filed: Apr. 26, 1999

(30) Foreign Application Priority Data

May 18, 1998 (JP) ............................................ 10-135410
May 18, 1998 (JP) ............................................ 10-135411

(51) Int. Cl.[7] ...................... H01L 27/148; H01L 29/768
(52) U.S. Cl. ...................... 257/232; 257/221; 257/234; 257/241
(58) Field of Search ........................ 257/221, 231–234, 257/241

(56) References Cited

U.S. PATENT DOCUMENTS

| | | | | |
|---|---|---|---|---|
| 4,987,466 A | * | 1/1991 | Shibata et al. .............. | 257/231 |
| 5,182,622 A | * | 1/1993 | Iizuka et al. ................. | 257/231 |
| 5,650,644 A | * | 7/1997 | Funakoshi et al. .......... | 257/241 |
| 5,914,506 A | * | 6/1999 | Nakashiba .................. | 257/221 |

* cited by examiner

*Primary Examiner*—Gene M. Munson
(74) *Attorney, Agent, or Firm*—Sughrue Mion, PLLC

(57) ABSTRACT

A charge transfer device which comprises vertical charge transfer devices which transfer charges in the vertical direction, first and second horizontal charge transfer devices which transfer the charges from the vertical charge transfer devices in the horizontal direction, and a shift gate which controls the charges from the vertical charge transfer devices to be supplied to one the first horizontal charge device or the second horizontal charge transfer device, wherein the first horizontal charge transfer device is a semiconductor region between the vertical charge transfer devices and the second horizontal charge transfer device and includes highly-doped regions having tapered portions whose one ends near the second horizontal charge transfer device are broader than another ends near the vertical charge transfer devices.

5 Claims, 16 Drawing Sheets

DUAL-LINE TYPE CHARGE TRANSFER DEVICE

This application is based on Japanese patent applications No. 10-135410 filed on May 18, 1998, and No. 10-135411 filed on May 18, 1998, the entire contents of which are incorporated herein by reference.

BACKGROUND OF THE INVENTION a) Field of the Invention

The present invention relates to a solid-state image pickup device, more particularly to a solid-state image pickup device having a dual-line type horizontal charge transfer device.

b) Description of the Related Art

FIG. 2 is a diagram showing the structure of a solid-state image pickup device 1 having a dual-line type horizontal charge transfer device 5.

A pixel array 2 comprises a plurality of photo diodes (photoelectric converter elements) 3 arranged in a flat matrix form, and a plurality of vertical charge transfer devices 4. The photo diodes 3 convert received lights into charges, and each of the photo diodes 3 corresponds to one of the pixels which form a two-dimensional image. The photo diodes 3 transfer the charges to the plurality of vertical charge transfer devices 4 which transfer the charges in the vertical direction.

The dual-line type horizontal charge transfer device 5 comprises a first horizontal charge transfer device 5a and a second horizontal charge transfer device 5b. The vertical charge transfer devices 4 and the horizontal charge transfer devices 5a and 5b comprise charge coupled devices (CCD). The charges in the vertical charge transfer devices 4 are transferred downward in the vertical direction toward one of the first horizontal charge transfer device 5a or the second horizontal charge transfer device 5b. The first and second horizontal charge transfer devices 5a and 5b horizontally transfer the charges leftward.

The first horizontal charge transfer device 5a transfers the charges to a first amplifier 6a. The first amplifier 6a amplifies the received charges and outputs the amplified charges. The second horizontal charge transfer device 5b transfers the charges to a second amplifier 6b. The second amplifier 6b amplifies the received charges and output the amplified charges.

A solid-state image pickup device used in, for example, a high definition television (HDTV), which is designed for high resolution image capturing is required to transfer charges quickly because it has a large number of photo diodes (pixels). In such a case, the solid-state image pickup device 1 having the dual-line type horizontal charge transfer device 5 is used in order to improve the charge transfer efficiency in the CCD and equalize amplification sensitivity.

The structure of a boundary area 7 between the first and second horizontal charge transfer devices 5a and 5b will now be described.

An upper diagram of FIG. 3 is a plan view showing the boundary area 7. The portrait direction of FIG. 3 corresponds to the landscape direction of FIG. 2. A shift gate 12 is disposed between the first and second horizontal charge transfer devices 5a and 5b. Graphs shown in middle and lower sections of FIG. 3 show potential energy variation in the boundary area 7 wherein the horizontal axes indicate positions in the boundary area 7 and the vertical axes indicate the potential energy variation against the charges (electrons).

Potential energy waveform S1 shown in the middle graph of FIG. 3 represents potential energy variation when the shift gate 12 is closed because a gate signal is not applied thereto. Since the shift gate 12 is closed, the charges in the first horizontal charge transfer device 5a which are transferred from the vertical charge transfer devices 4 (FIG. 2) stay in the first horizontal charge transfer device 5a.

Potential energy waveform S2 shown in the lower graph of FIG. 3 represents potential energy variation when the shift gate 12 is open after the gate signal is applied thereto. When the gate signal is applied to the shift gate 12, potential energy of the second horizontal charge transfer device 5b decreases because the second horizontal charge transfer device 5b is biased. Since the shift gate 12 is open, the charges in the first horizontal charge transfer device 5a which are transferred from the vertical charge transfer devices 4 (FIG. 2) are further transferred in the vertical direction (the landscape direction in FIG. 3) toward the second horizontal charge transfer device 5b. The transferred charges 13 will stay in the second horizontal charge transfer device 5b after the shift gate 12 is closed.

That is, the charges in the vertical charge transfer devices are controlled so as to be transferred one of the first and second horizontal charge transfer device 5a and 5b by switching the shift gate 12.

An upper diagram in FIG. 4 is a plan view for explaining a transfer operation of the charges 11 in the first horizontal charge transfer device 5a.

The horizontal charge transfer device 5a comprises groups each consisting of a first well region W1, a first barrier region B1, a second well region W2 and a second barrier region B2. A predetermined number of the groups are arranged in the horizontal direction. A drive signal H$\phi$1 is applied to the first well region W1 and the first barrier region B1. A drive signal H$\phi$2 is applied to the second well region W2 and the second barrier region B2. That is, the horizontal charge transfer device 5a is driven by the dual-phase drive signals H$\phi$1 and H$\phi$2.

Graphs shown in middle and lower sections of FIG. 4 represent the potential energy variation in the horizontal charge transfer device 5a wherein the horizontal axis indicates positions in the horizontal charge transfer device 5a and the vertical axis indicates the potential energy variation.

Potential energy waveform S1 shown in the middle graph of FIG. 4 represents potential energy variation when the drive signals H$\phi$1 and H$\phi$2 are 0V. Effective dopant concentration is adjusted so that the potential energy of the well regions W1 and W2 is lower than that of the barrier regions B1 and B2. For example, the well regions W1 and W2 are n-type regions having high dopant concentration and the barrier regions B1 and B2 are n-type regions having low dopant concentration. The well regions W1 and W2 show almost the same potential energy level. The barrier regions B1 and B2 also show almost the same potential energy level.

Potential energy waveform S2 shown in the lower graph of FIG. 4 represents potential energy variation when the drive signal H$\phi$1 is 5V while the drive signal H$\phi$2 is 0V. According to the graph, potential energy gradient appears in the horizontal charge transfer device 5a. That is, the potential energy level gradually decreases from higher potential energy region B2 to lower potential energy region W1. In the horizontal charge transfer device 5a, the charges 11 are transferred leftward in the horizontal direction in accordance with the potential gradient.

FIGS. 5A to 5D are cross sectional views showing a device for explaining steps of manufacturing a horizontal charge transfer device (charge coupled device) in the prior art.

As shown in FIG. 5A, n-type dopant 23 is added to a p-type silicon region 21 of a silicon substrate by ion implantation. As a result, an n-type silicon region 22 is formed on the p-type silicon region 21.

Then, a silicon oxide layer 24 is formed on the n-type silicon region 22 as shown in FIG. 5B, and then patterned first poly gates 25 made of amorphous silicon are formed on the silicon oxide layer 24. The first poly gates 25 work as electrodes for the well regions W1 and W2.

Then, p-type dopant 27 is added to the substrate by ion implantation as shown in FIG. 5C. During the doping, the first poly gates 25 work as a mask. As a result, p-type silicon regions 26 are formed on exposed surfaces of the n-type silicon regions 22 which are unmasked by the first poly gates 25. The p-type silicon regions 26 and the n-type silicon regions 22 underneath correspond to the barrier regions B1 and B2 respectively. The n-type silicon regions 22 under the first poly gates 25 correspond to the well regions W1 and W2.

As shown in an upper diagram of FIG. 5D, the silicon oxide layer is subjected to anisotropy etching so as to be etched partially. During the etching, the first poly gates 25 work as a mask. Then, a silicon oxide layer 28 is deposited onto the whole surface of the substrate by thermal oxidization and/or CVD. And then, patterned second poly gates 29 made of amorphous silicon are formed on the silicon oxide layer 28. The first poly gates 25 work as gate electrodes for controlling the n-type silicon regions (well regions) 22 beneath, and the second poly gates 29 work as gate electrodes for controlling the p-type silicon regions (barrier regions) 26 thereunder and the n-type silicon regions 22 under the p-type silicon regions 26.

A lower diagram of FIG. 5D is a graph showing potential energy waveform S1 which represents potential energy variation in the n-type regions 22 when a voltage applied to the first and second poly gates 25 and 29 are 0V. The p-type silicon regions 26 under the second poly gates 29 and the n-type silicon regions 22 under the p-type silicon regions 26 are barrier regions B1 and B2 because their potential energy level is high. On the contrary, the n-type silicon regions 22 under the first poly gates 25 are well regions W1 and W2 because their potential energy level is low.

The first and second horizontal charge transfer devices can transfer the charges in the horizontal direction in accordance with the applied drive signals Hφ1 and Hφ2. In case of the dual-line type horizontal charge transfer device 5, however, it is difficult to realize smooth charge transfer in the vertical direction from the first horizontal charge transfer device 5a to the second horizontal charge transfer device 5b in accordance with the controlled shift gate 12 without affecting the horizontal charge transfer.

A dual-line type horizontal charge transfer device 5 which is designed to resolve the above problem will now be described.

FIG. 6A shows the structure of the boundary area 7 (FIG. 2) in the prior art. The shift gate 12 is disposed between the first and second horizontal charge transfer devices 5a and 5b. The order of the four regions shown in FIG. 6A differs from that of the four regions shown in FIG. 4 for the sake of explanation convenience. That is, the group of the four regions shown in FIG. 6A starts with the region W2 (the leftmost region) which is two regions behind the starting region of the region group shown in FIG. 4.

Each of the horizontal charge transfer devices 5a and 5b comprises the groups of the regions which are arranged horizontally. Each of the groups comprises the second well region W2, the second barrier region B2, the first well region W1 and the first barrier region B1. The drive signal Hφ1 is applied to the first well region W1 and the first barrier region B1, and the drive signal Hφ2 is applied to the second well region W2 and the second barrier region B2. The horizontal charge transfer devices 5a and 5b are driven by the dual-phase drive signals Hφ1 and Hφ2.

The well regions W1, W2 and the barrier regions B1, B2 on the first horizontal charge transfer device 5a are tapered. In the well regions, each one end near the second horizontal charge transfer device 5b is broader than another end. In the barrier regions B1 and B2, on the contrary, each one end near the second horizontal charge transfer device 5d is narrower than another end.

In FIG. 6B, broken lines represent electric field appeared in the first well region W1. Since the well region W1 has the tapered shape, a side effect causes the broader end portion of the well region W1 to have a higher voltage (lower potential energy) than the narrower end. And built-in potentials caused by the differences in the dopant concentration appear around boundaries between the well region W1 and adjacent regions, that is, the barrier regions B1 and B2. Potential energies around the boundaries are lower than those around the center of the well region W1. Accordingly, the tapered well region W1 causes smooth potential gradient in the vertical direction.

As indicated by the potential energy waveform S2 shown in FIG. 4, the charges 11 are horizontally transferred to the first well region W1. And then, the charges 31 in the well region W1 are transferred downward in the vertical direction as shown in FIG. 6A in accordance with the potential gradient. In response to opening the shift gate 12, the charges 31 are transferred to the second horizontal charge transfer device 5b through channel stop regions 33a and 33b. Dopant whose conductance is reversed to that of the well regions W1 and W2 is added to the channel stop regions 33a and 33b. The potential energy of the channel stop regions 33a and 33b is higher than that of the well regions W1, W2 and the barrier regions B1, B2.

FIG. 16 is a cross-sectional view showing the well region W1 and the barrier region B2 along a line A—A shown in FIG. 6A. As shown in FIG. 16, the shift gate 12, the well region gate electrodes 25 and the barrier region gate electrodes 29 are formed on the silicon oxide layer 24 which cover the well regions W1 and the barrier regions B2. The shift gate 12 and the gate electrodes 25 and 29 are insulated from each other via the silicon oxide layer 24. The shift gate 12 is formed so as to be placed just above the boundary between the well region W1 and the barrier region B2. The shift gate 12 works as an electrode to shift the charges from the first horizontal charge transfer device 5a to the second horizontal charge transfer device 5b.

The method of forming the well region gate electrodes 25 and the barrier region gate electrodes 29 is aforementioned with reference to FIGS. 5A to 5D. Voltages are applied to the well region W1 and the barrier region B2 through the well region gate electrode 25 and the barrier region gate electrode 29.

Since the well region W1 is tapered, smooth potential energy gradient appears, thus, the charges are smoothly transferred in the vertical direction. However, it is difficult to obtain large potential gradient because available potential gradient is limited.

SUMMARY OF THE INVENTION

It is an object of the present invention to provide a charge transfer device which can smoothly transfer charges from a first charge transfer device to a second charge transfer device.

It is another object of the present invention to provide a method of manufacturing a charge coupled device which is adaptable to a solid-state image pickup device having a dual-line type horizontal charge transfer device for smoothly transferring charges in the vertical direction.

According to one aspect of the present invention, it is provided a charge transfer device which comprises:

a first charge transfer device including well regions having low potential energy and barrier regions having high potential energy, which can transfer charges supplied thereto from an external device;

a second charge transfer device which can transfer charges supplied thereto from said external device via said first charge transfer device; and a shift gate between said first and second charge transfer devices, which control the externally supplied charges to be transferred to said first charge transfer device or said second charge transfer device, wherein said first charge transfer device is a semiconductor region between said external device and said second charge transfer device; and each of said well regions of said first charge transfer device comprises a first highly-doped region including a poorly-doped region and a tapered section whose one end near said second charge transfer device is broader than another end near said external device.

According to another aspect of the present invention, it is provided a charge transfer device which comprises vertical charge transfer devices which transfer charges in the vertical direction, first and second horizontal charge transfer devices which transfer the charges from the vertical charge transfer devices in the horizontal direction, and a shift gate which controls the charges from the vertical charge transfer devices to be supplied to one the first horizontal charge device or the second horizontal charge transfer device, wherein the first horizontal charge transfer device is a semiconductor region between the vertical charge transfer devices and the second horizontal charge transfer device and includes highly-doped regions having tapered portions whose one ends near the second horizontal charge transfer device are broader than another ends near the vertical charge transfer devices.

Since the well region in the first horizontal charge transfer device has a tapered highly-doped region whose one end near the second horizontal charge transfer device is broader than another end near the vertical charge transfer devices, a potential energy grade appears. That is, the potential energy near the vertical charge transfer device is higher than that near the second horizontal charge transfer device. Since the charges are smoothly transferred from the first horizontal charge transfer device to the second horizontal charge transfer device, charge transfer efficiency is improved.

According to still another aspect of the present invention, it is provided a method of manufacturing charge coupled devices to be used in a solid-state image pickup device which comprises a first horizontal charge transfer device which horizontally transfers charges supplied from a plurality of vertical charge transfer devices, a second horizontal charge transfer device which horizontally transfers the charges supplied from said plurality of vertical charge transfer devices via said first horizontal charge transfer device, and a shift gate which selectively supplies the charges from said plurality of vertical charge transfer devices to said first horizontal charge transfer device or said second horizontal charge transfer device wherein said first horizontal charge transfer device comprises said charge coupled devices, said method comprises the steps of:(a) forming on a semiconductor substrate first n-type regions to be said first horizontal charge transfer device;(b) forming a first insulation layer on said first n-type regions;(c) forming a patterned first electrode layer on said first insulation layer comprising electrodes for transferring the charges in said first horizontal charge transfer device;(d) doping n-type dopant into said semiconductor substrate by ion implantation while using said first electrode layer as a mask to form well region s on said first horizontal charge transfer device; and (e) doping n-type dopant into predetermined regions on said well regions by ion implantation while using said first electrode layer as a partial mask.

The well regions are self-aligned by ion implantation while using the first electrode layer as a mask. Moreover, highly-doped n-type regions are selfaligned in predetermined regions by doping n-type dopant into the predetermined regions on the well regions by ion implantation while partially using the first electrode layer as a mask. Forming the highly-doped n-type regions so as to have tapered shape helps a dual-line type horizontal charge transfer device consisting of charge coupled devices in a solid-state image pickup device to improve its vertical charge transfer efficiency. The first horizontal charge transfer device can smoothly transfer the charges not only in the horizontal direction but also in the vertical direction toward the second horizontal charge transfer device.

BRIEF DESCRIPTION OF THE DRAWINGS

FIG. 8A is a plan view showing a substrate, and FIG. 8B is a cross-sectional view along a line 8B—8B shown in FIG. 8A;

FIG. 9A is a plan view showing the substrate, and FIG. 9B is a cross-sectional view along a line 9B—9B shown in FIG. 9A;

FIG. 10A is a plan view showing the substrate, and FIG. 10B is a cross-sectional view along a line 10B—10B shown in FIG. 10A;

FIG. 11A is a plan view showing the substrate, and FIG. 11B is a cross-sectional view along a line 11B—11B shown in FIG. 11A;

FIG. 12A is a plan view showing the substrate, FIG. 12B is a cross-sectional view along a line 12B—12B shown in FIG. 12A, and FIG. 12C is a (vertical) cross-sectional view showing the substrate shown in FIG. 12A along a line 12C—12C.

FIG. 13A is a plan view showing the substrate, and FIG. 13B is a cross-sectional view along a line 13B—13B shown in FIG. 13A;

DETAILED DESCRIPTION OF THE PREFERRED EMBODIMENT

Figure 1A:
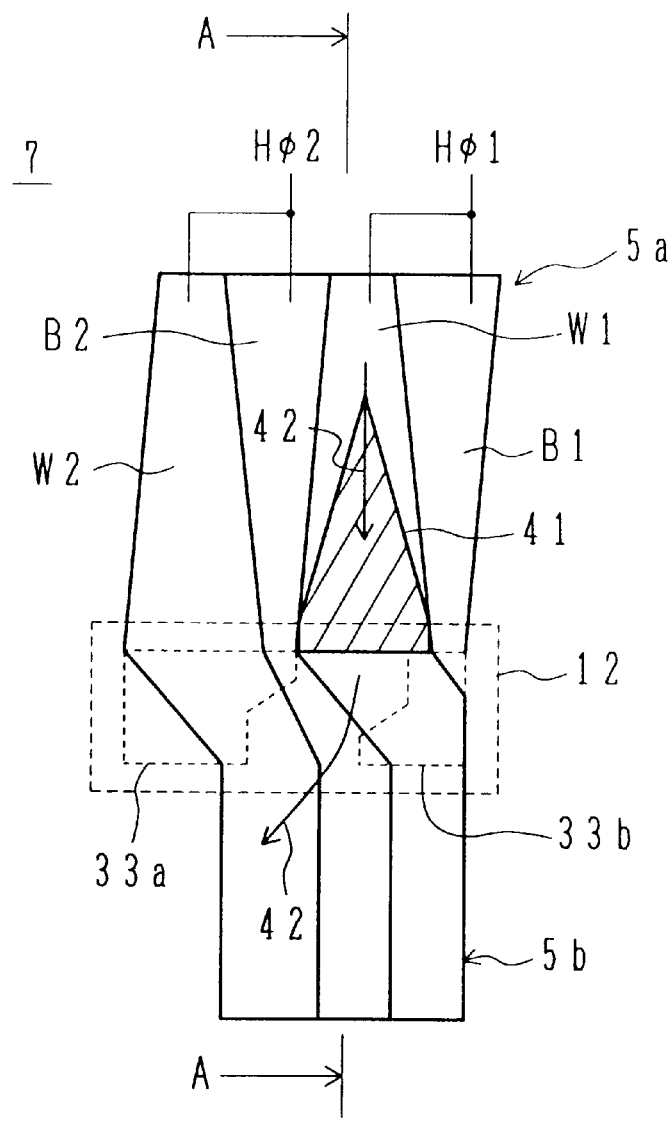
FIG. 1A is a plan view showing a dual-line type horizontal charge transfer device according to the first embodiment of the present invention and FIG. 1B is a plan view showing a highly-doped region.

FIG. 1A is a plan view showing a dual-line type horizontal charge transfer device according to a first embodiment of the present invention. Illustrated therein is the detailed structure of an area 7 shown in FIG. 2.

A shift gate 12 is sandwiched between a first horizontal charge transfer device 5a and a second horizontal charge transfer device 5b. Charges in the first horizontal charge transfer device 5a are shifted to the second horizontal charge transfer device 5b when the shift gate 12 is open.

Each of the horizontal charge transfer devices 5a and 5b comprises horizontally arranged groups of well regions and barrier regions. Each of the groups has a second well region W2, a second barrier region B2, a first well region W1 and a first barrier region B1. A drive signal H$\phi$1 is applied to the first well region W1 and the first barrier region B1, and another drive signal H$\phi$2 is applied to the second well region W2 and the second barrier region B2. The horizontal charge transfer devices 5a and 5b are driven with the dual-phase drive signals H$\phi$1 and H$\phi$2.

Figure 16:
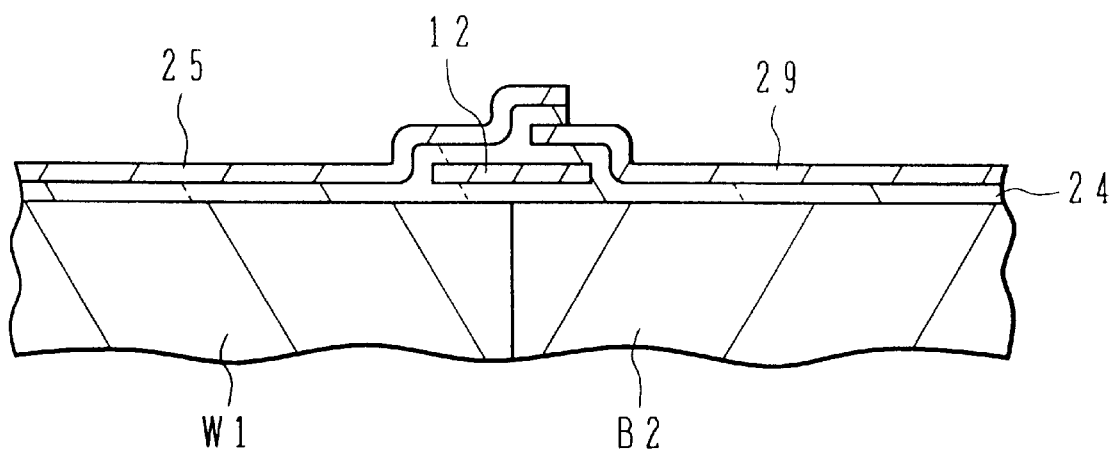
FIG. 16 is a cross-sectional view along a line A—A shown in FIG. 6A.

The well regions W1 and W2 on the first horizontal charge transfer device 5a have tapered shape, that is, each one end near the second horizontal charge transfer device 5b is broader than another end. The barrier regions B1 and B2 also have tapered shape, and each one end near the second horizontal charge transfer device 5b is narrower than another end. A cross-sectional view along a line A—A shown in FIG. 1A is the same as a diagram shown in FIG. 16, and description thereof is incorporated herein by reference.

Figure 6A:
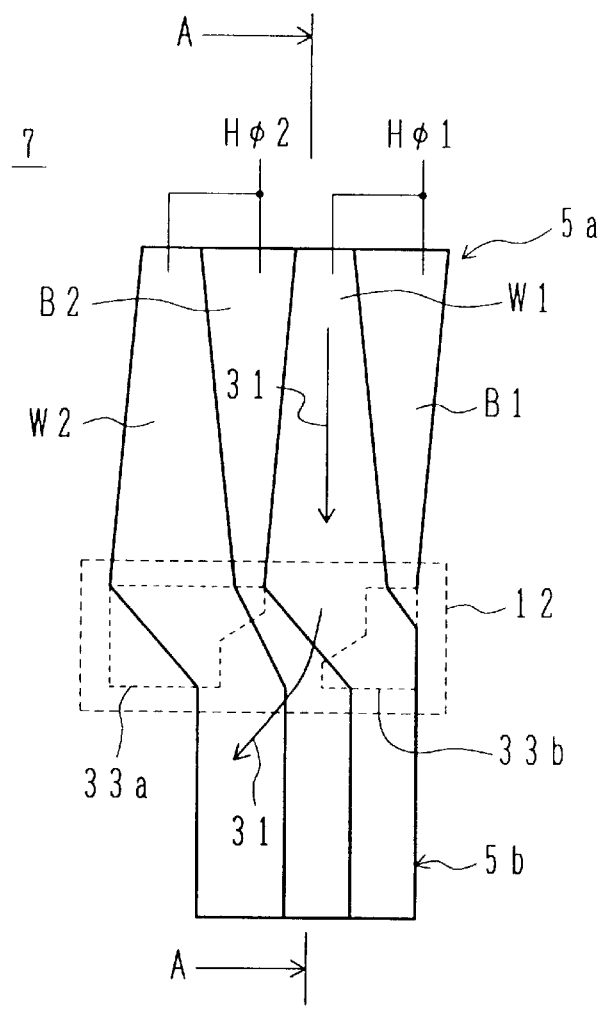
FIG. 6A is a plan view showing a conventional dual-line type horizontal charge transfer device.
Figure 6B:
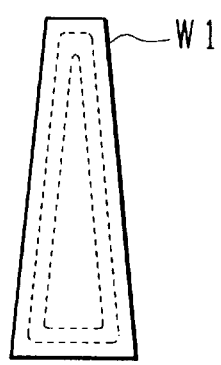
FIG. 6B is a plan view shoring a conventional well region.

Similar to the aforementioned description with reference to FIG. 6B, the well region W1 shown in FIG. 1A also causes the potential gradient, that is, applied voltage around a broader end of the well region W1 is higher than that around the narrower end. In other words, the potential energy around the broader end is lower than that around the narrower end. Accordingly, the tapered shape of the well region W1 causes smooth potential gradient in the vertical direction.

A highly-doped region 41 is formed on the first well region W1. In FIG. 1A, a hatched region represents the region 41. The region 41 has tapered shape like the first well region W1. A preferable shape for the region 41 is a triangle. The region 41 is formed so as to cover the boundary between the first horizontal charge transfer device 5a and the shift gate 12.

Figure 1B:
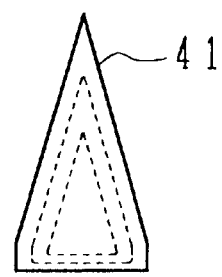

FIG. 1B is a plan view showing the highly-doped region 41, and broken lines represent electric field therein. Dopant concentration difference between the highly-doped region 41 and the well region W1 causes appearance of built-in potential around boundaries. In the highly-doped region 41, the applied voltage near the well region W1 is lower than that around the center thereof. In other words, potential energy near the well region W1 is higher than that around the center. Since the highly-doped region 41 has a tapered shape, smooth potential gradient in the vertical direction appears.

Figure 4:
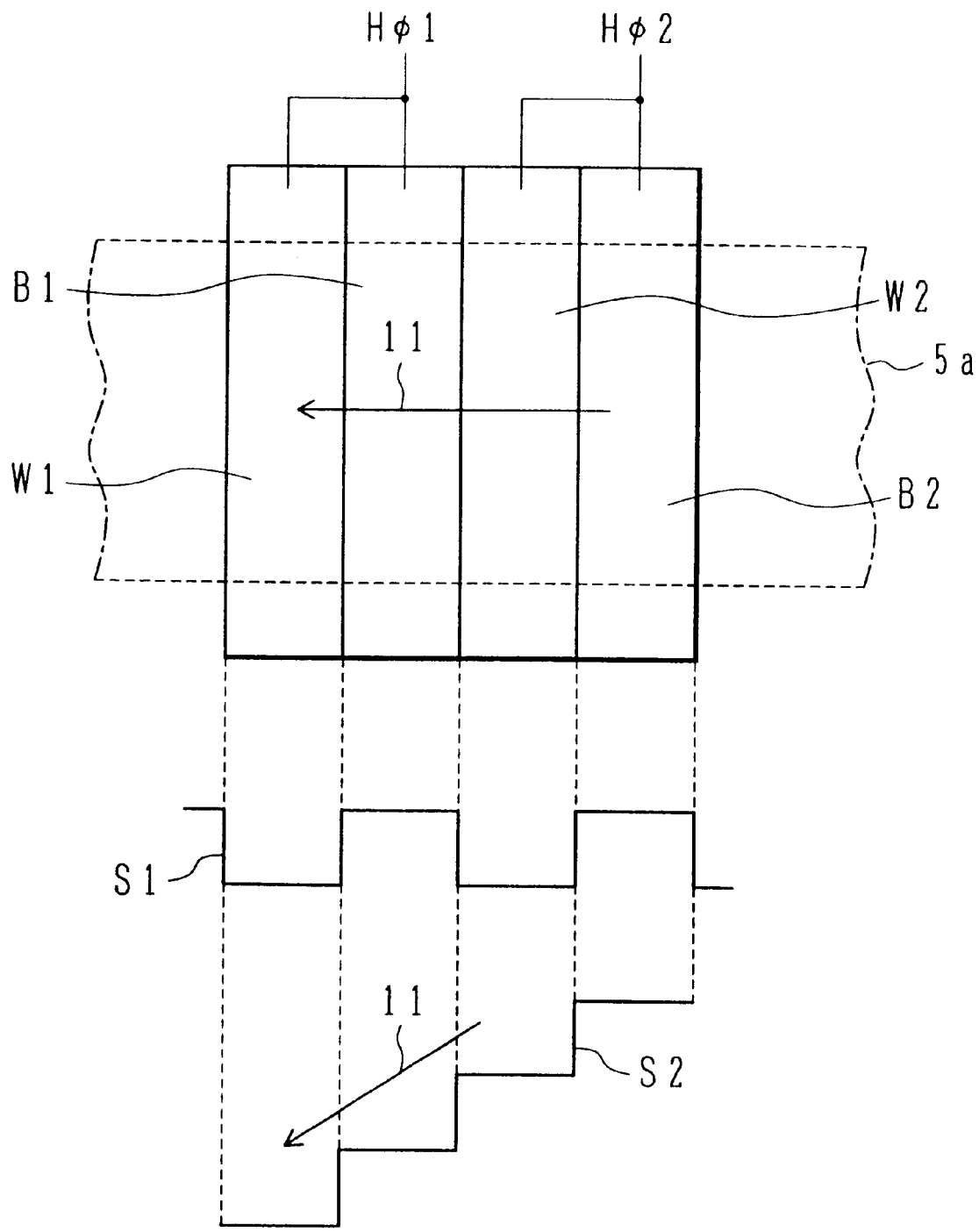
FIG. 4 is a plan view showing a first horizontal charge transfer device and a graph showing potential energy waveform.
Figure 5A:
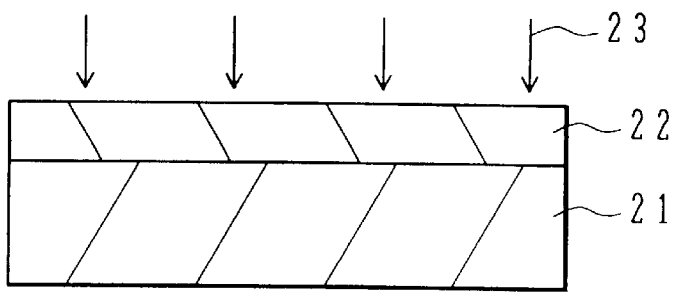
FIGS. 5A to 5D are diagrams showing conventional steps of manufacturing a horizontal charge transfer device (charge coupled device)
Figure 5B:
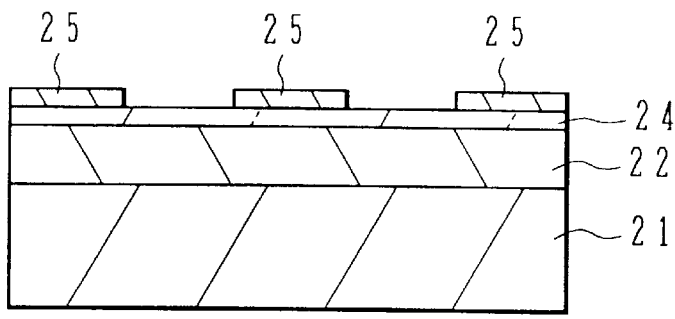
Figure 5C:
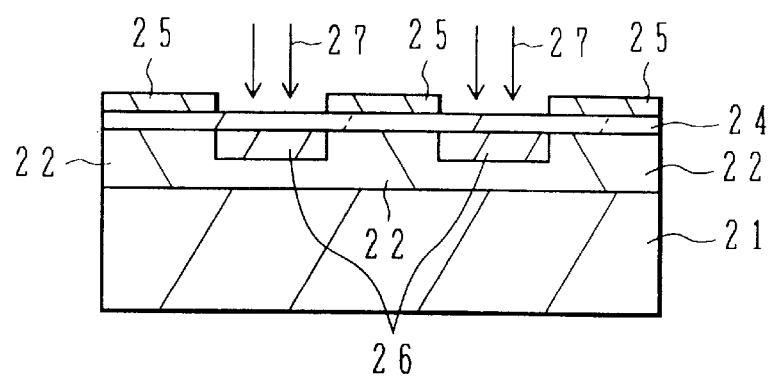
Figure 5D:
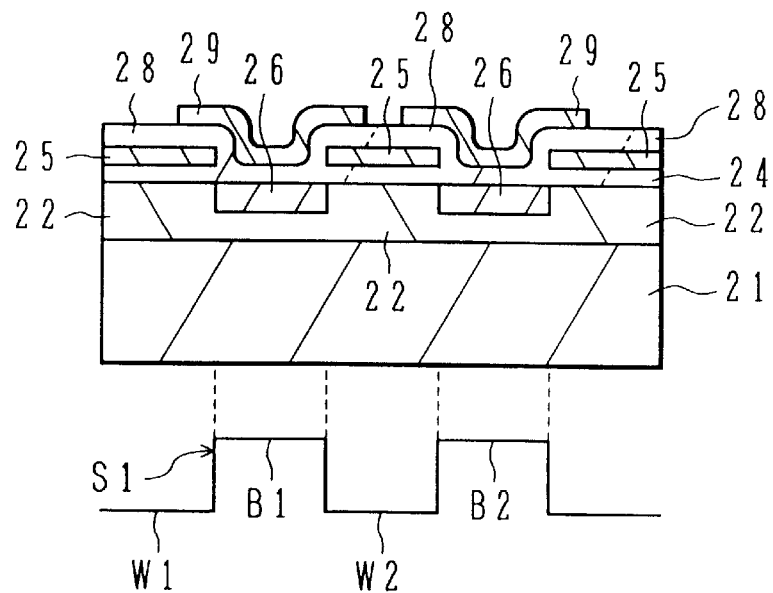

Potential energy variation of the horizontal charge transfer device 5a is basically the same as the potential energy waveforms S1 and S2 shown in FIG. 4. The order of the four regions shown in FIG. 1A differs from that of the four regions shown in FIG. 4. That is, the group of the four regions shown in FIG. 1A starts with the region W2 (the leftmost region) which is two regions behind the starting region of the region group shown in FIG. 4. As seen from the potential waveform S2 shown in FIG. 4, charges 11 are horizontally transferred to the first well region W1 when the drive signal H$\phi$1 is 5V. As shown in FIG. 1A, charges 42 in the well region W1 are vertically transferred downward in accordance with the potential gradients caused by the tapered well region W1 and tapered highly-doped region 41. And then, the charges 42 are transferred to the second horizontal charge transfer device 5b through channel stop regions 33a and 33b after a gate signal supplied to the shift gate 12 opens the shift gate 12.

As described in the above, the tapered well region W1 and highly-doped region 41 help to generate smooth but sharp potential gradient even though no electric field is applied thereto. As a result, the charges are transferred in the vertical direction smoothly.

The tapered highly-doped regions 41 may be combined with rectangular well regions W1, W2 and barrier regions B1, B2 as shown in FIG. 4. In this case, the potential gradient also appears, however, its sharpness is less than the above described case.

The above described horizontal charge carrier devices 5a and 5b are manufactured through the steps shown in FIGS. 5A to 5D. A step of forming the highly-doped region 41 should be added to those steps. In this step, ion implantation is carried out against a substrate whose surface is masked by photo resist so that predetermined regions are exposed.

In this case, however, it is difficult to form the highly-doped region 41 exactly on a predetermined place. That is, the highly-doped region 41 tends to invade the barrier regions B1 or B2 adjacent to the well region W1 (the highly-doped region 41 may be misaligned). For example, a partial highly-doped region 41a is formed on the barrier region B1 and another partial highly-doped region 41b is formed on the barrier region B2. Those misaligned regions 41a and 41b may cause the following problems.

Figure 7A:
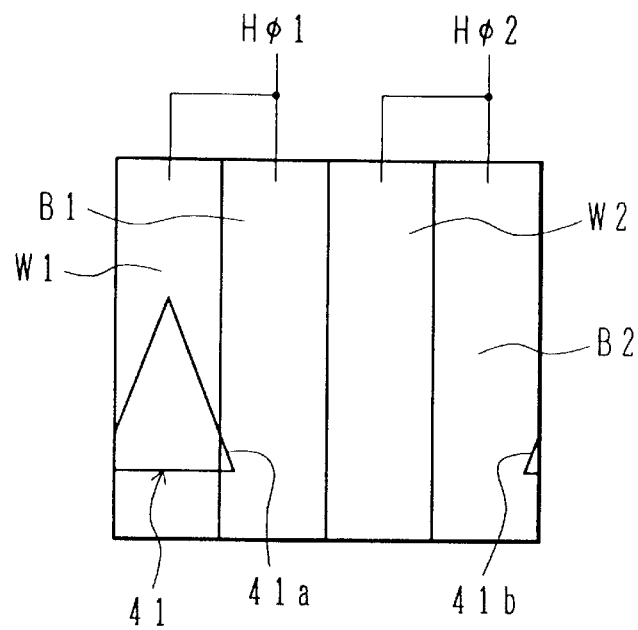
FIG. 7A is a plan view showing a first horizontal charge transfer device.
Figure 7B:
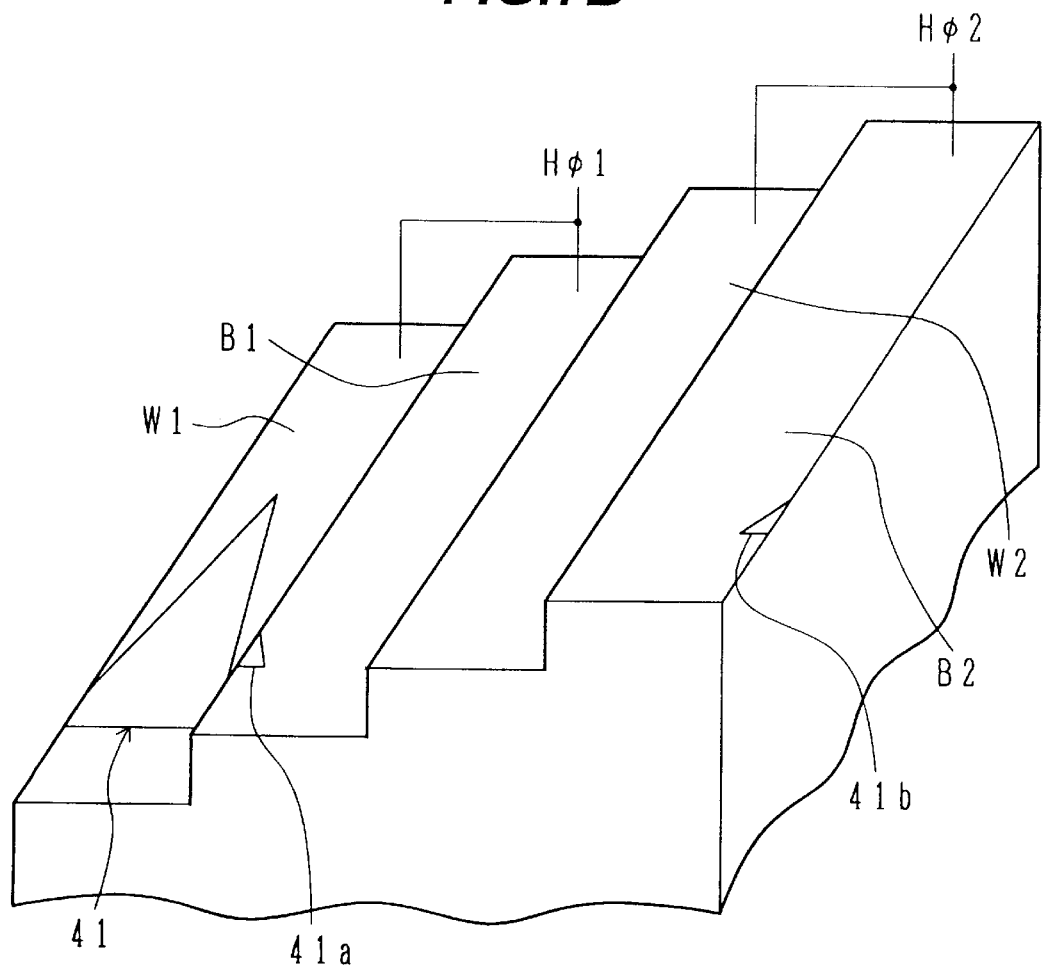
FIG. 7B is a 3D diagram showing potential energy variation in the first horizontal charge transfer device.

FIG. 7B is a perspective view three dimensionally showing the potential energy variation of the horizontal charge transfer device shown in FIG. 7A. Rectangular well regions W1, W2 and barrier regions B1, B2 are shown in FIGS. 7A and 7B for simplifying the diagrams. The following problems may occur in case where the tapered well regions W1, W2 and barrier regions B1, B2 are used. FIG. 7B represents the potential energy variation when the drive signal Hϕ1 is 5V and the drive signal Hϕ2 is 0V.

Since the most of the tapered highly-doped region 41 is formed on the well region W1, the vertical potential gradient appears.

The partial highly-doped region 41a is formed on the barrier region B1, and the partial highly-doped region 41b is formed on the barrier region B2. The potential energy of the partial highly-doped regions 41a and 41b on the barrier regions B1 and B2 is relatively lower than that of the rest of the region. Those partial highly-doped regions 41a and 41b are so called potential pockets in which the charges stay. Such potential pockets may deteriorate the charge transfer efficiency. Especially, the partial highly-doped region 41b prevents the charges from being transferred smoothly in the horizontal direction.

A method of manufacturing a horizontal charge transfer device (charge coupled device) without forming the potential pockets will now be described with reference to FIGS. 8A to 13B.

Figure 8A:
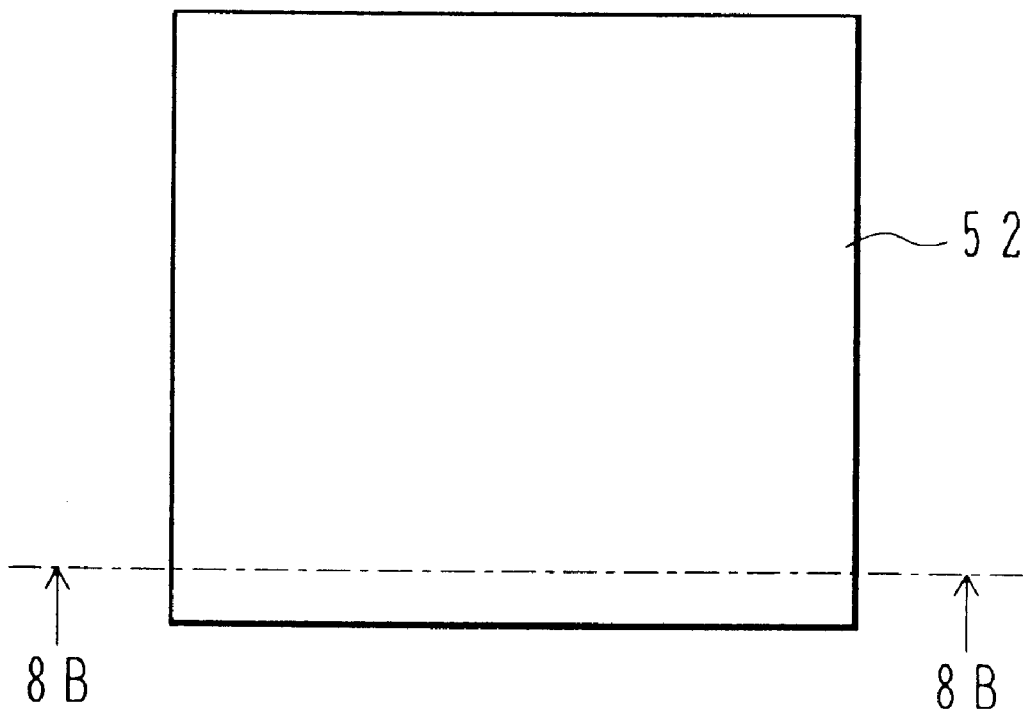
FIGS. 8A and 8B are diagrams showing steps of manufacturing a horizontal charge transfer device (charge coupled device)
Figure 8B:
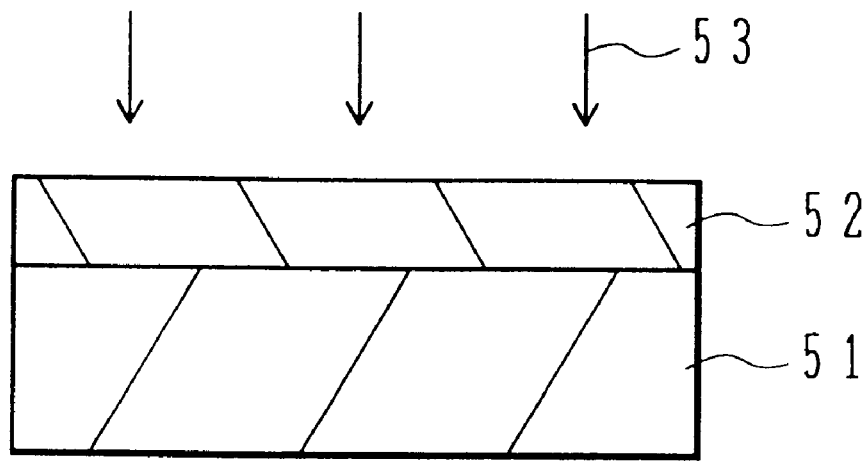

FIG. 8A is a plan view showing a silicon substrate and FIG. 8B is a cross-sectional view showing the silicon substrate shown in FIG. 8A along a line 8B—8B. As shown in FIG. 8B, n-type dopant 53 is added to a p-type silicon region 51 by ion implantation to form an n-type silicon region 52 on the p-type silicon region 51.

The n-type dopant 53 consists of, for example, phosphorous or arsenic. The phosphorous dopant ion implantation is carried out under, for example, dose of $1 \times 10^{11}$ to $1 \times 10^{12}$ cm$^{-2}$ and acceleration energy of 10 to 50 keV.

Figure 9A:
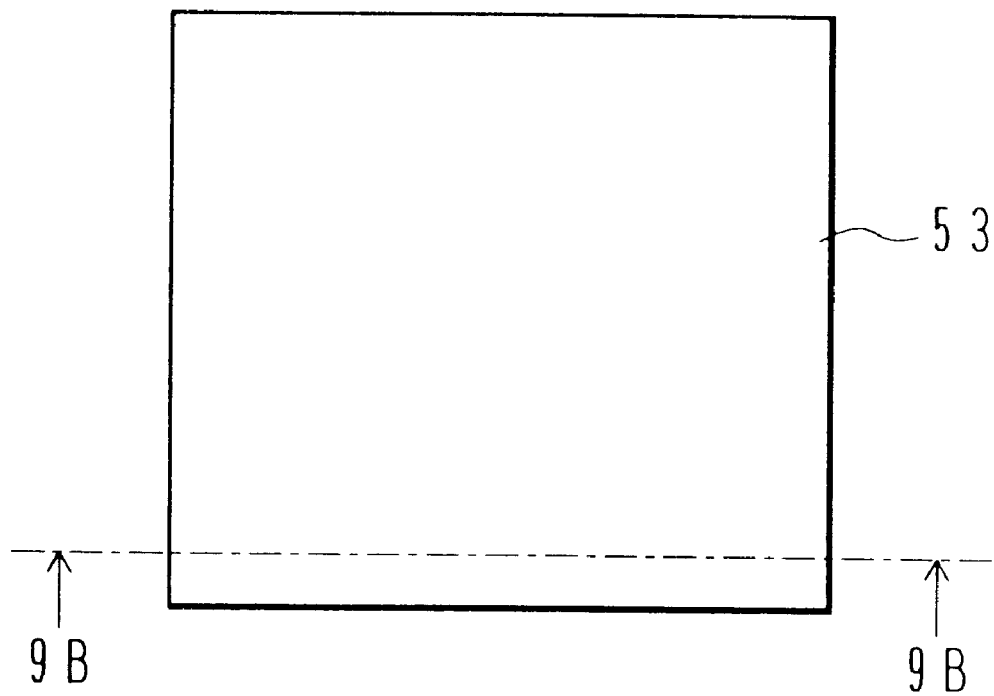
FIGS. 9A and 9B are diagrams showing the following steps of manufacturing the horizontal charge transfer device.
Figure 9B:
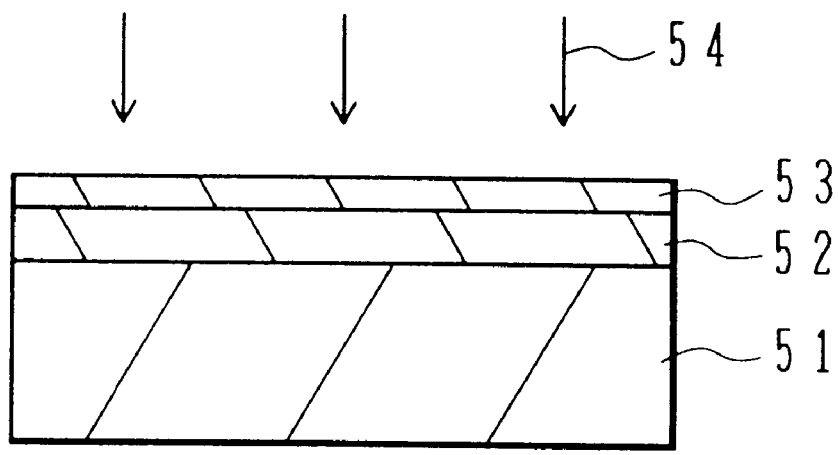

FIG. 9A is a plan view showing the substrate and FIG. 9B is a cross-sectional view showing the substrate shown in FIG. 9A along a line 9B—9B. As shown in FIG. 9B, p-type dopant 54 is added to the n-type silicon region 52 by ion implantation. As a result, an n$^-$-type poorly-doped silicon region 53 is formed on the n-type silicon region 52 by dopant compensation.

The p-type dopant 54 consists of, for example, boron. In this case, ion implantation is carried out under, for example, dose of $1 \times 10^{11}$ to $1 \times 10^{12}$ cm$^{-2}$ and acceleration energy of 10 to 50 keV. The amount of the p-type dopant 54 must be less than that of the n-type dopant 53 shown in FIG. 8B.

Figure 10A:
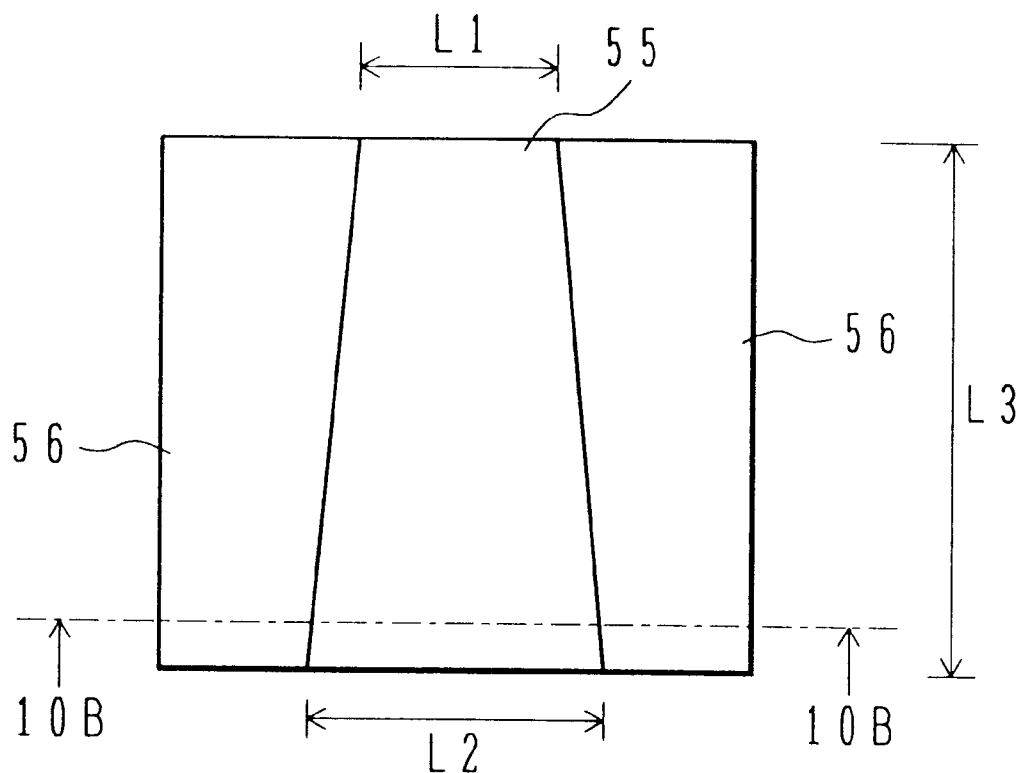
FIGS. 10A and 10B are diagrams showing the following steps of manufacturing the horizontal charge transfer device.
Figure 10B:
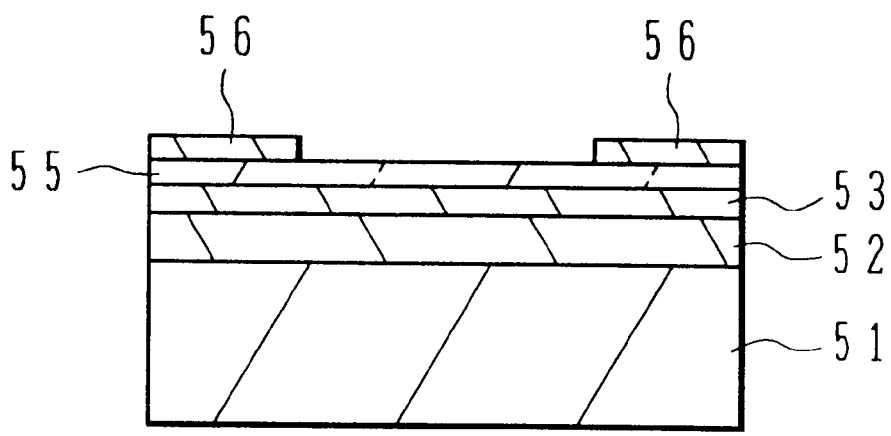

FIG. 10A is a plan view showing the substrate, and FIG. 10B is a cross-sectional view showing the substrate along a line 10B—10B. As shown in FIG. 10B, an silicon oxide layer 55 is deposited onto the n$^-$-type silicon region 53 by chemical vapor deposition (CVD), and then patterned first amorphous silicon poly gates 56 are formed on the silicon oxide layer 55.

A method of patterning the first poly gates 56 is photolithography or etching which is carried out after the deposition of the amorphous silicon onto the whole surface of the substrate by CVD is completed. The first poly gates 56 work as electrodes above the barrier regions B1 and B2.

FIG. 10A shows an area, where the silicon oxide layer 55 is exposed, onto which an area to be the well regions W1 or W2 underneath is projected. The area has tapered shape, that is, one end near the second horizontal charge transfer device is broader than another end. Details of the area where the silicon oxide layer 55 is exposed are, for example, one base L1 of 3.6 microns, another base L2 of 5.8 microns and a height L3 of 7.5 microns.

FIG. 10A partially shows areas, where the first poly gates 56 are formed, onto which the barrier regions B1 or B2 underneath is projected. As shown in FIG. 1A, the areas have tapered shapes, that is, each one end near the second horizontal charge transfer device 5b is narrower than another end.

Figure 11A:
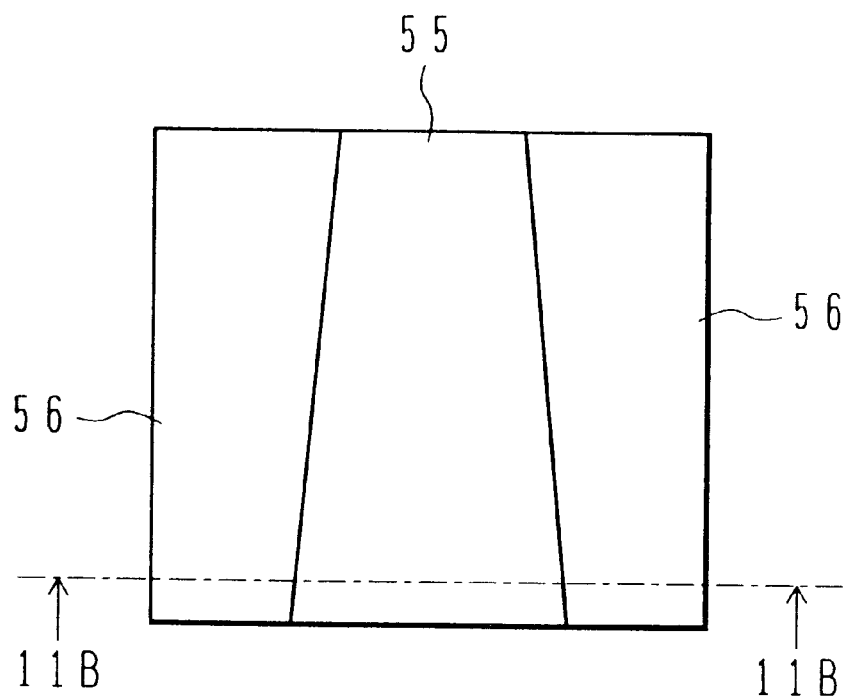
FIGS. 11A and 11B are diagrams showing the following steps of manufacturing the horizontal charge transfer device.
Figure 11B:
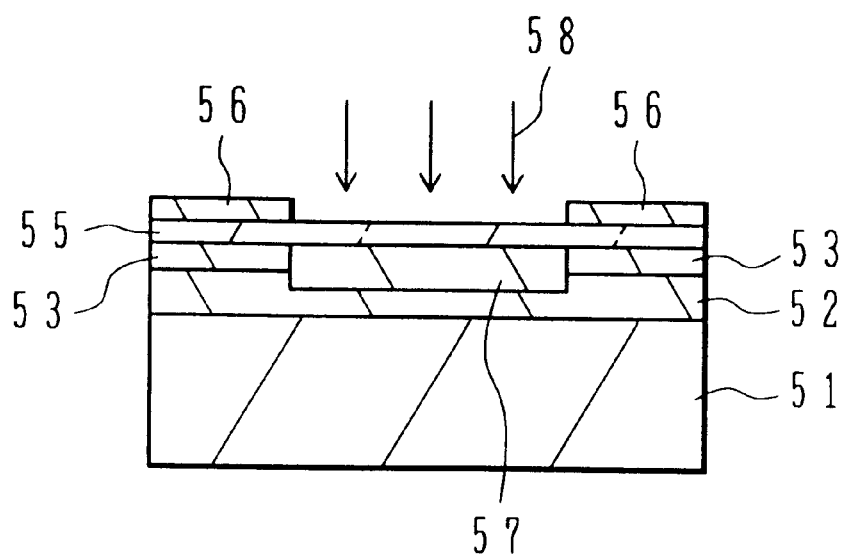

FIG. 11A is a plan view showing the substrate, and FIG. 11B is a cross-sectional view of the substrate shown in FIG. 11A along a line 11B—11B. As shown in FIG. 11B, n-type dopant 58 is added to the substrate by ion implantation. During the ion implantation, the first poly gates 56 work as a mask. N-type silicon regions 57 are formed by self-aligning on exposed regions among the first poly gates 56.

Concentration of n-type dopant in the n-type silicon region 57 is higher than that in the n$^-$-type silicon region 53. The n-type silicon regions 57 correspond to the well regions W1 and W2. The n$^-$-type silicon regions 53 correspond to the barrier regions B1 and B2.

The n-type dopant consists of, for example, phosphorous or arsenic. The ion implantation of the phosphorous dopant is carried out under, for example, dose of $1 \times 10^{11}$ to $1 \times 10^{12}$ cm$^{-2}$ and acceleration energy of 10 to 50 keV. In this case, ratio of dopant concentration in the n-type silicon region 57 and the n$^-$-type silicon region 53 is, for example, 6:1.

Figure 12A:
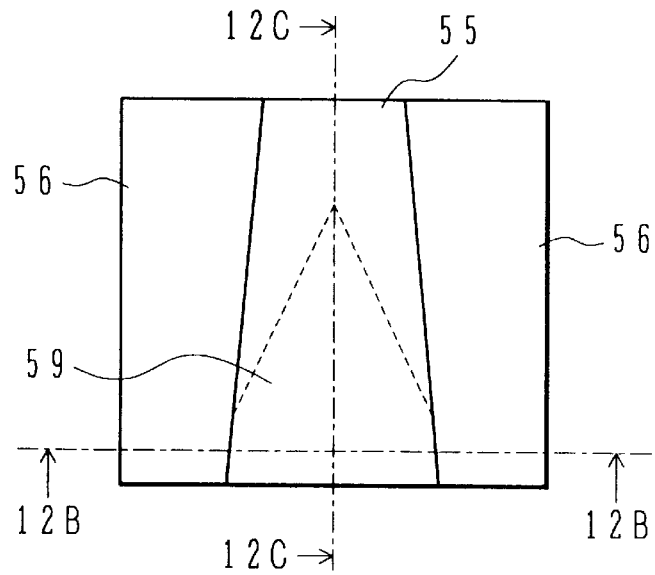
FIGS. 12A—12C are diagrams showing the following steps of manufacturing the horizontal charge transfer device.
Figure 12B:
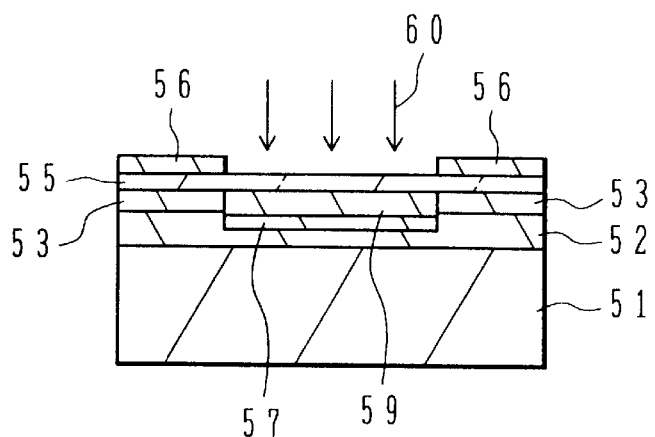
Figure 12C:
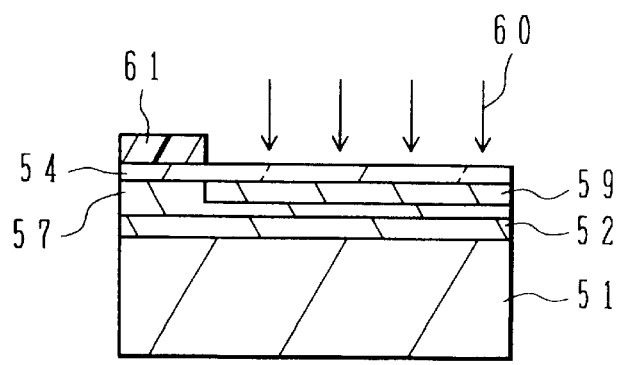

FIG. 12A is a plan view showing the substrate, FIG. 12B is a (horizontal) cross-sectional view showing the substrate shown in FIG. 12A along a line 12B—12B, and FIG. 12C is a (vertical) cross-sectional view showing the substrate shown in FIG. 12A along a line 12C—12C. A patterned photo resist mask 61 is formed on the substrate in order to form a tapered highly-doped region 59. To simplify the diagram, the resist mask 61 is not shown in FIG. 12A.

N-type dopant 60 is added to the substrate by ion implantation. During the ion implantation, the resist mask 61 and the first poly gates 56 work as masks. Highly-doped tapered N$^+$-type silicon regions 59 are formed on unmasked n-type silicon region 57.

Since the n$^+$-type silicon regions 59 are selfaligned while being masked with the resist mask 61 and the first poly gates 56, it does not invade areas adjacent to the n-type silicon regions (well regions) 57. That is, this method prevents the n$^+$-type silicon regions 59 from invading the n-type silicon regions (barrier regions) 53. As a result, the potential pocket regions 41a and 41b (FIG. 7A, 7B) do not appear. Masking by the first poly gates 56 helps to form the n$^+$-type silicon region 59 just above the n-type silicon region (well region) 57. The resultant shape of the n$^+$-type silicon region 59 is a triangle in which portions each between a side and a base are cut away like the hatched area shown in FIG. 1A.

The n-type dopant 60 consist of, for example, phosphorous or arsenic. The ion implantation is carried out under, for example, dose of $1 \times 10^{10}$ to $1 \times 10^{12}$ cm$^{-2}$ and acceleration energy of 10 to 50 keV. Ratio of dopant concentration in the n$^+$-type silicon region 59, the n-type silicon region 57 and the n$^-$-type silicon region 53 is, for example, 1:0.06: 0.01.

Figure 13A:
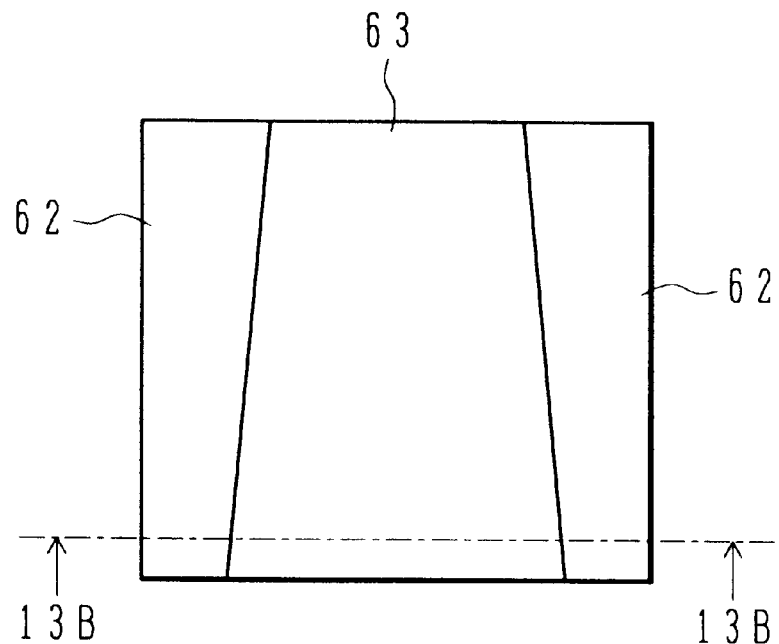
FIGS. 13A and 13B are diagrams showing the following steps of manufacturing the horizontal charge transfer device.
Figure 13B:
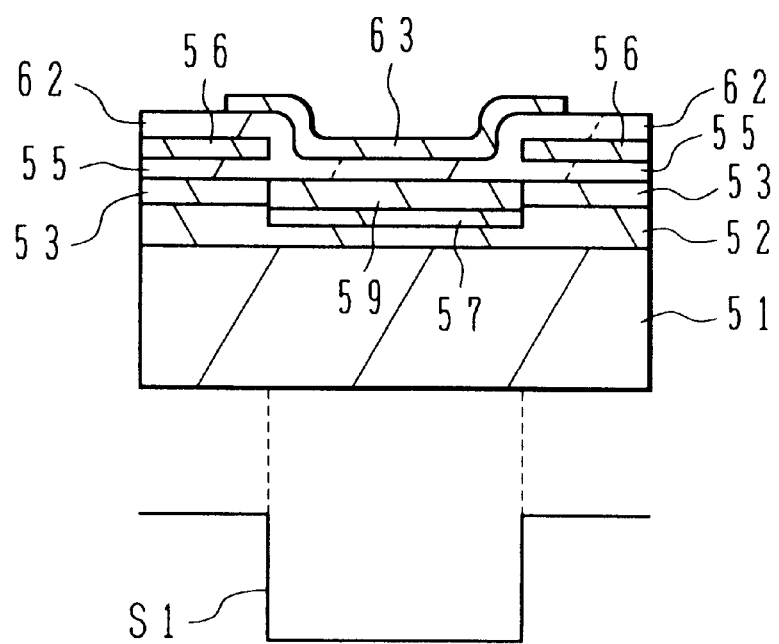

FIG. 13A is a plan view showing the substrate, and an upper diagram shown in FIG. 13B is a cross-sectional view showing the substrate along a line 13B—13B. Anisotropy etching is carried out to partially etch the silicon oxide layer 55 while using the first poly gates 56 as a mask. And then, another silicon oxide layer 62 is formed on the whole surface of the substrate by thermal oxidization and/or CVD. Further, patterned second poly gates 63 made of amorphous silicon are formed on the silicon oxide layer 62.

Amorphous silicon is deposited onto the whole surface of the substrate. The deposited silicon is patterned by photolithography or etching, thus, the second poly gates 63 are formed so as to cover the area representing the projection of the n-type silicon region (well region) 57 underneath.

The first poly gates 56 work as gate electrodes to control the n⁻-type silicon regions (barrier regions) 53, and the second poly gates 63 work as gate electrodes to control the n-type silicon regions (well regions) 57 and the n⁺-type silicon regions 59.

A lower diagram shown in FIG. 13B shows potential energy waveform S1 which represents potential energy waveforms when voltages applied to the first and second poly gates 56 and 63 are 0V. The n⁻-type silicon regions 53 become barrier regions B1 and B2 having high potential energy. The n-type silicon regions 57 and n⁺-type silicon regions 59 become the well regions W1 and W2 having low potential energy.

Thus, the first and second horizontal charge transfer devices 5a and 5b are completed. Since the tapered n⁺-type silicon regions 59 are self-aligned with using the first poly gates 56 as a mask, they do not invade other regions adjacent to the n-type silicon regions (well regions) 57. Such self-alignment also prevents appearance of the potential pocket regions 41a and 41b shown in FIGS. 7A and 7B.

Figure 2:
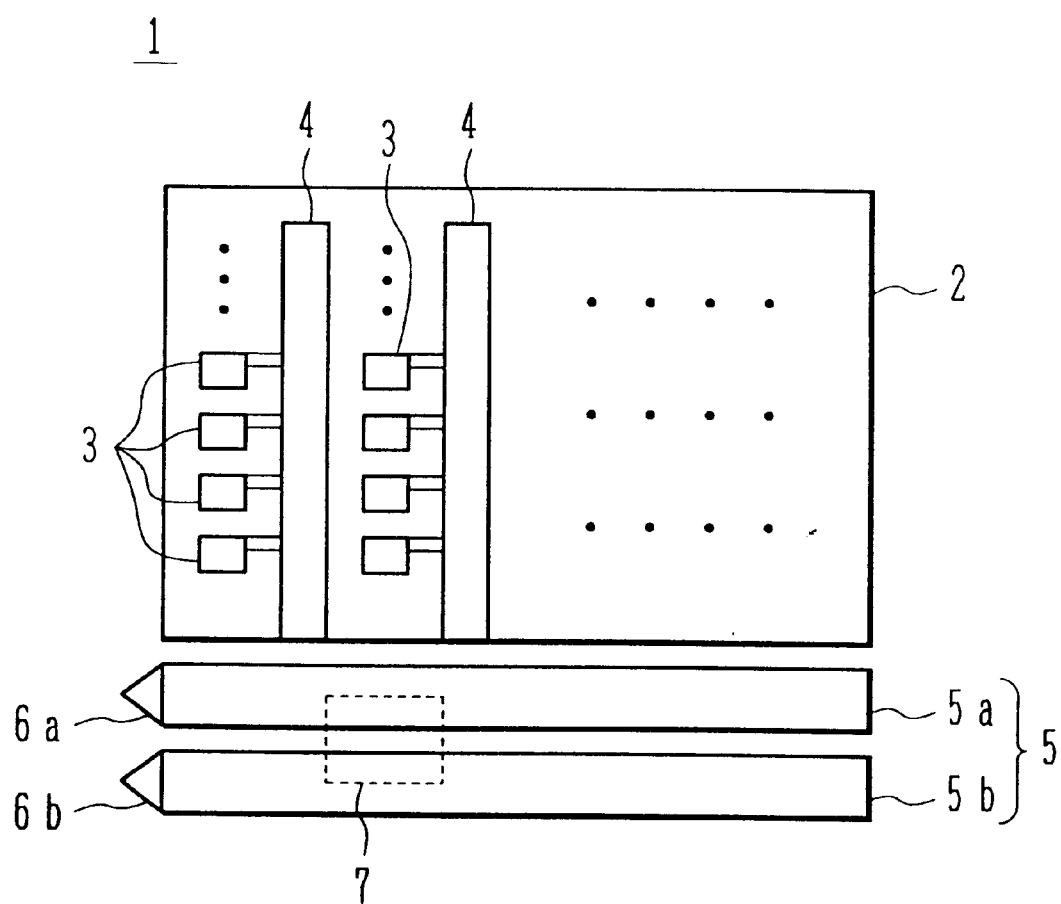
FIG. 2 is a plan view showing a solid-state image pickup device.
Figure 3:
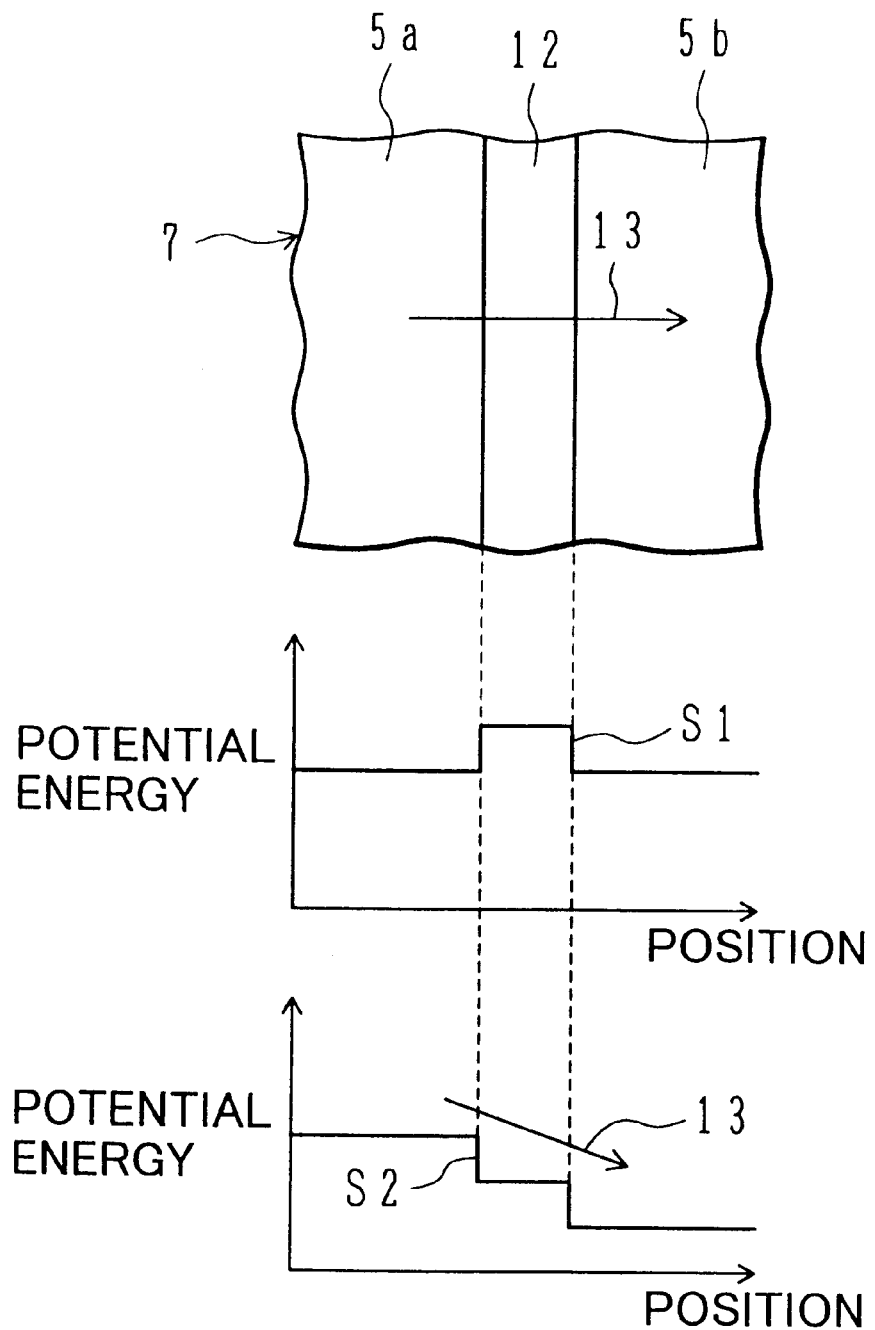
FIG. 3 is a plan view showing the dual-line type horizontal charge transfer device and graphs indicating potential energy waveforms.
Figure 14:
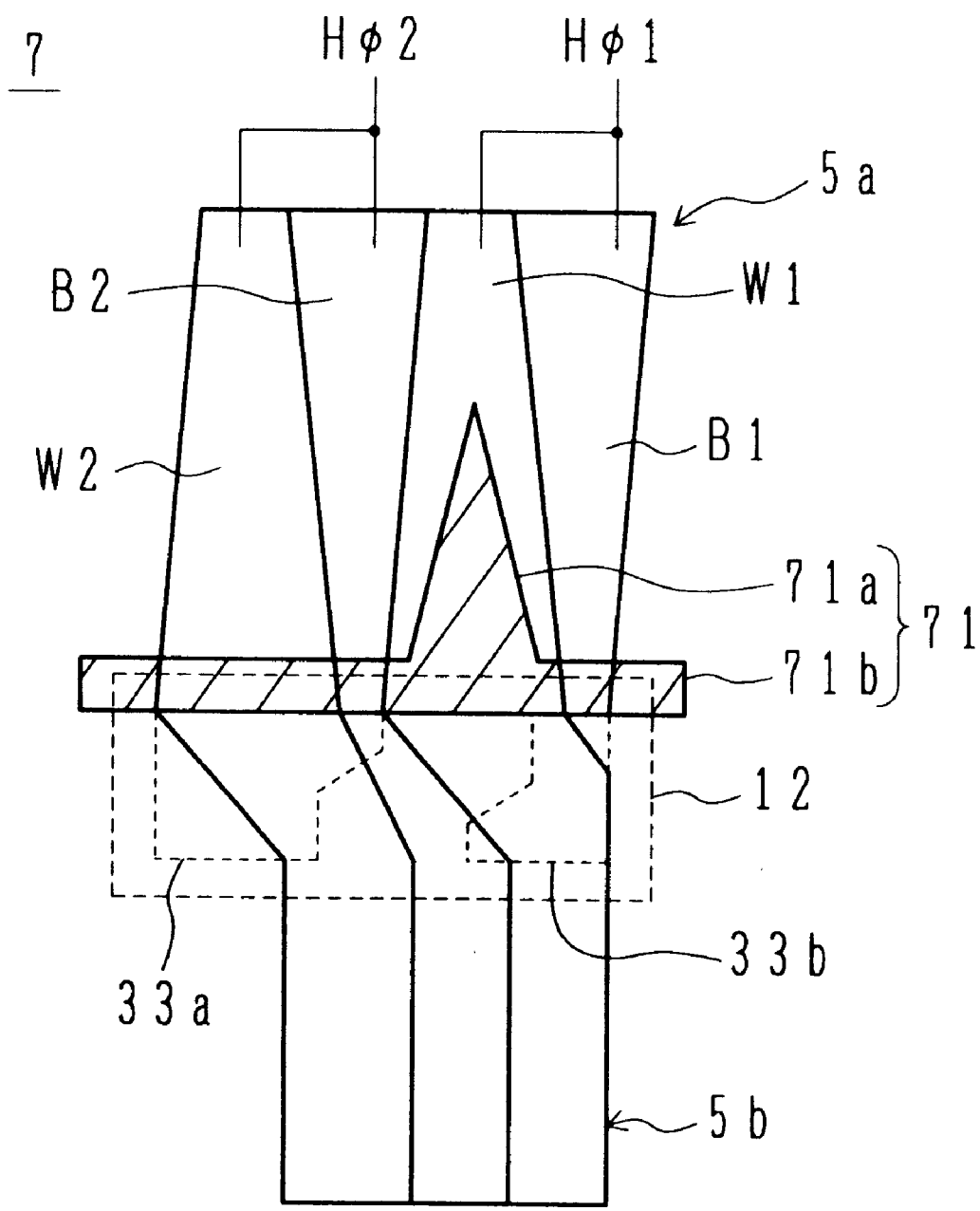
FIG. 14 is a plan view showing a dual-line type horizontal charge transfer device according to the second embodiment of the present invention.

FIG. 14 is a plan view showing a dual-line type horizontal charge transfer device according to a second embodiment of the present invention, more particularly, showing the detailed structure of the area 7 shown in FIG. 2. The structure of the dual-line type horizontal charge transfer device according to the second embodiment is almost the same as that described in the first embodiment shown in FIG. 1A except highly-doped regions. The second embodiment features a highly-doped region 71 comprising adjacent triangular region 71a and horizontally elongated region 71b. Appearance of the potential pockets caused by misaligned highly-doped regions is prevented by the horizontal charge transfer device having the aforementioned highly-doped region 71. Detailed structure will now be described.

Like or same reference numerals as used in FIG. 1A are also used in FIG. 14 to denote corresponding components. Since the well region W1 is tapered, smooth potential gradient in the vertical direction appears.

The highly-doped region 71 is formed on the boundary between the first horizontal charge transfer device 5a and the shift gate 12. The highly-doped region 71 comprises the triangular region 71a and the horizontally elongated region 71b.

The region 71a has tapered shape as well as the first well region W1, that is, its one end near the second horizontal charge transfer device 5b is broader than another end. A preferable shape for the region 71a is a triangle.

The horizontally elongated region 71b is formed so as to cover the boundary between the first horizontal charge transfer device 5a and the shift gate 12. That is, the elongated region 71b rests on the boundary between the shift gate 12 and the well and barrier regions W1, W2, B1 and B2.

Figure 15:
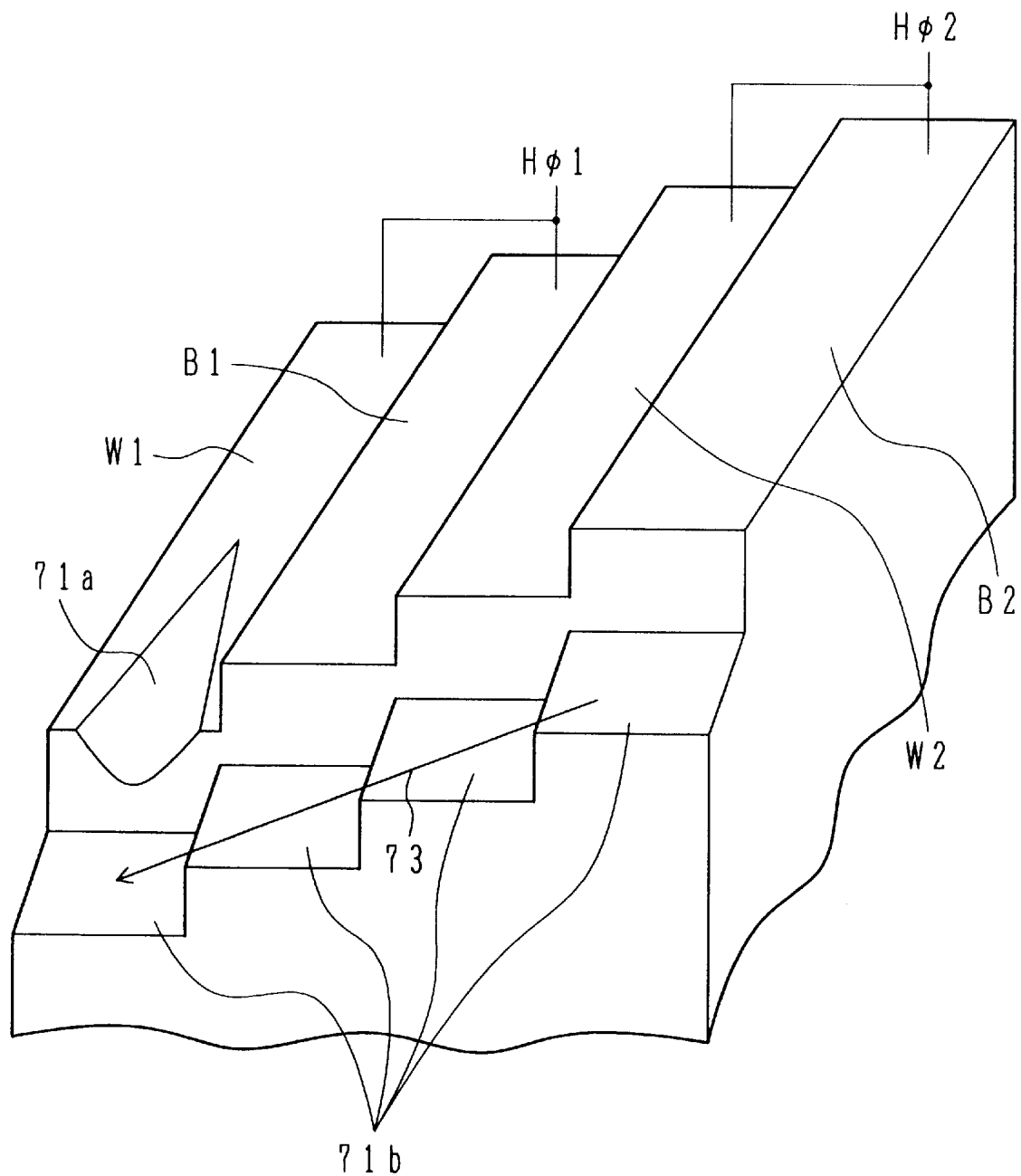
FIG. 15 is a 3D diagram showing potential energy variation in the dual-line type horizontal charge transfer device shown in FIG. 14.

FIG. 15 is a perspective view three-dimensionally showing the potential energy variation in the horizontal charge transfer device shown in FIG. 14. In FIG. 15, rectangular well regions W1, W2 and barrier regions B1, B2 are shown in order to simplify the diagram, however, the resultant potential energy variation is found in a case where the well regions W1, W2 and the barrier regions B1, B2 are tapered. FIG. 15 shows the potential energy variation when the drive signal Hφ1 is 5V and the drive signal Hφ2 is 0V.

Since the tapered highly-doped region 71a is formed on the well region W1, potential energy gradient in the vertical direction appears in the region 71a. Because the potential energy of the elongated highly-doped region 71b is relatively low, it seems like a trench (side ditch) beside the first horizontal charge transfer device 5a on which electrons flow. The highly-doped region 71b works as such potential trench between the first horizontal charge transfer device 5a and the shift gate 12.

The charges 73 transfers in the horizontal direction along the potential trench 71b. Since the region 71b forms the potential trench, the potential pocket regions 41a and 41b as shown in FIG. 7B do not appear. The highly-doped region 71 may be formed without fine alignment accuracy.

As described in the above, since the region 71b works as the potential trench at the ends of the first horizontal charge transfer device 5a near the second horizontal charge transfer device 5b, the potential pockets caused by misaligned highly-doped region 71 do not appear.

The first horizontal charge transfer device 5a can smoothly transfer the charges in the vertical direction toward the second horizontal charge transfer device 5b without influencing the horizontal charge transfer.

Rectangular well regions W1, W2 and barrier regions B1, B2 as shown in FIG. 4 may be employed in the second embodiment.

The horizontal charge transfer devices 5a and 5b are manufactured through steps similar to the steps shown in FIGS. 5A to 5D or FIGS. 8A to 13B. However, the highly-doped region 71 must be shaped so as to have the aforementioned specific shape.

According to the first and second embodiments, the tapered highly-doped region on the well region W1 in the first horizontal charge transfer device 5a is effective in generating smooth vertical potential gradient without applying the electric field. Thus, the first horizontal charge transfer device 5a can smoothly transfer the charges in the vertical direction toward the second horizontal charge transfer device 5b without influencing the horizontal charge transfer.

According to the second embodiment, since the region 71b works as the potential trench at the ends of the first horizontal charge transfer device 5a near the second horizontal charge transfer device 5b, the potential pockets caused by misaligned highly-doped region 71 do not appear.

The dual-line type horizontal charge transfer device may be modified as a dual-line type charge transfer device. That is, the dual-line charge transfer device may be used as, for example, a dual-line type vertical charge transfer device or a line (linear) sensor. The vertical charge transfer devices 4 shown in FIG. 2 may be structured by a dual-line type vertical charge transfer device in accordance with steps similar to the aforementioned manufacturing steps.

The present invention has been explained with reference to the embodiments. However, the present invention is not limited to the embodiments, and various modifications, combinations, etc. are possible, as should be apparent those skilled in the art.

What is claimed is:

1. A charge transfer device comprising:
   a first charge transfer device including well regions having low potential energy and barrier regions having high potential energy, which can transfer charges supplied thereto from an external device;
   a second charge transfer device which can transfer charges supplied therefrom from said external device via said first charge transfer device; and
   a shift gate between said first and second charge transfer devices, which controls the externally supplied charges to be transferred to said first charge transfer device or said second charge transfer device, wherein said first charge transfer device is a semiconductor region between said external device and said second charge transfer device; and each of said well regions of said first charge transfer device comprises a first region having a first dopant concentration and a second region having a second dopant concentration, said first region forming a tapered section whose first end near said second charge transfer device is broader than a second end of the tapered section near said external device, wherein said first end and said second end of the tapered section are joined by first and second side segments and wherein both the first and second side segments are displaced from respective side portions of the barrier regions, wherein said first region is made of n-type silicon whose n-type dopant concentration is higher than that of said second region of said well regions.

2. A charge transfer device comprising:

a first charge transfer device including well regions having low potential energy and barrier regions having high potential energy, which can transfer charges supplied thereto from an external device;

a second charge transfer device which can transfer charges supplied therefrom from said external device via said first charge transfer device; and a shift gate between said first and second charge transfer devices, which controls the externally supplied charges to be transferred to said first charge transfer device or said second charge transfer device, wherein said first charge transfer device is a semiconductor region between said external device and said second charge transfer device; and each two of said well regions of said first charge transfer device comprises a first region having a first dopant concentration and a second region having a second dopant concentration lower than said first dopant concentration, said first region forming a tapered section whose first end near said second charge transfer device is broader than a second end of the tapered section near said external device, wherein said first end and said second end of the tapered section are joined by first and second side segments and wherein both the first and second side segments are displaced from respective side portions of the barrier regions, a third charge transfer device which transfers the charges in the vertical direction, wherein said first and second charge transfer devices transfer the charges in the horizontal direction;

said first charge transfer device is placed between said second and third charge transfer device, and horizontally transfers the charges supplied from said third charge transfer device;

said second charge transfer device horizontally transfers the charges supplied from said third charge transfer device via said first charge transfer device;

said shift gate controls the charges from said third charge transfer device to be supplied to said first charge transfer device or said second charge transfer device; and said first region has a tapered section whose one end near said second charge transfer device is broader than another end near said third charge transfer device, wherein said first region is made of n-type silicon whose n-type dopant concentration is higher than that of said second region of said well regions.

3. A charge transfer device comprising:

a first charge transfer device including well regions having low potential energy and barrier regions having high potential energy, which can transfer charges supplied thereto from an external device;

a second charge transfer device which can transfer charges supplied thereto from said external device via said first charge transfer device; and a shift gate between said first and second charge transfer devices, which controls the externally supplied charges to be transferred to said first charge transfer device or said second charge transfer device, wherein said first charge transfer device is a semiconductor region between said external device and said second charge transfer device; and each of said well regions of said first charge transfer device comprises a first region having a first dopant concentration and a second region having a second dopant concentration, wherein said first dopant concentration is higher than said second dopant concentration, said first region forming a tapered section whose first end near said second charge transfer device is broader than a second end near said external device; said charge transfer device further including a third region comprising highly-doped regions formed to overlap said well regions and said barrier regions of the first charge device, said third regions being connected to said first region to overlap a boundary between said first charge transfer device and said shift gate, wherein said first region having said first dopant concentration forms an isosceles triangle.

4. A charge transfer device comprising:

a first charge transfer device including well regions having low potential energy and barrier regions having high potential energy, which can transfer charges supplied thereto from an external device;

a second charge transfer device which can transfer charges supplied therefrom from said external device via said first charge transfer device; and a shift gate between said first and second charge transfer devices, which controls the externally supplied charges to be transferred to said first charge transfer device or said second charge transfer device, wherein said first charge transfer device is a semiconductor region between said external device and said second charge transfer device; and each of said well regions of said first charge transfer device comprises a first region having a first dopant concentration and a second region having a second dopant concentration, said first region forming a tapered section whose first end near said second charge transfer device is broader than a second end of the tapered section near said external device, wherein said first end and said second end of the tapered section are joined by first and second side segments and wherein both the first and second side segments are displaced from respective side portions of the barrier regions, wherein said well regions are made of n-type silicon, and said barrier regions are made of n-type silicon whose n-type dopant concentration is lower than that of said second regions, wherein a ratio of a dopant concentration in said first region to a dopant concentration in said second region is 1:0.06.

5. A charge transfer device comprising:

a first charge transfer device including well regions having low potential energy and barrier regions having high potential energy, which can transfer charges supplied thereto from an external device;

a second charge transfer device which can transfer charges supplied therefrom from said external device via said first charge transfer device; and a shift gate between said first and second charge transfer devices, which controls the externally supplied charges to be transferred to said first charge transfer device or said second charge transfer device, wherein said first charge transfer device is a semiconductor region between said external device and said second charge transfer device; and each of said well regions of said first charge transfer device comprises a first region having a first dopant concentration and a second region having a second dopant concentration, said first region forming a tapered section whose first end near said second charge transfer is broader than a second end of the tapered section near said external device, wherein said first end and said second end of the tapered section are joined by first and second side segments and wherein both the first and second side segments are displaced from respective side portions of the barrier regions, a third charge transfer device which transfers the charges in the vertical direction, wherein said first and second charge transfer devices transfer the charges in the horizontal direction;

said first charge transfer device is placed between said second and third charge transfer device, and horizontally transfers the charges supplied from said third charge transfer device;

said second charge transfer device horizontally transfers the charges supplied from said third charge transfer device via said first charge transfer device;

said shift gate controls the charges from said third charge transfer device to be supplied to said first charge transfer device or said second charge transfer device; and said first region has a tapered section whose one end near said second charge transfer device is broader than another end near said third charge transfer device, wherein said well regions are made of n-type silicon, and said barrier regions are made of n-type silicon whose n-type dopant concentration is lower than that of said second regions, wherein a ratio of a dopant concentration in said first region to a dopant concentration in said second region is 1:0.06.

\* \* \* \* \*